United States Patent [19]

Hartley

[11] Patent Number: 5,773,836
[45] Date of Patent: Jun. 30, 1998

[54] METHOD FOR CORRECTING PLACEMENT ERRORS IN A LITHOGRAPHY SYSTEM

[75] Inventor: John George Hartley, Fishkill, N.Y.

[73] Assignee: International Business Machines Corporation, Armonk, N.Y.

[21] Appl. No.: 739,137

[22] Filed: Oct. 28, 1996

[51] Int. Cl.$^6$ .................................................. H01J 37/304
[52] U.S. Cl. .......................................................... 250/491.1
[58] Field of Search .......................................... 250/491.1

[56] References Cited

U.S. PATENT DOCUMENTS

| | | | |
|---|---|---|---|
| 4,442,361 | 4/1984 | Zasio et al. | 250/491.1 |
| 4,678,919 | 7/1987 | Sugishima et al. | 250/491.1 |
| 5,301,124 | 4/1994 | Chan et al. | 364/490 |
| 5,424,548 | 6/1995 | Puisto | 250/491.1 |

FOREIGN PATENT DOCUMENTS

| 4-37022 | 2/1992 | Japan | H01L 21/027 |
|---|---|---|---|

*Primary Examiner*—Jack I. Berman
*Attorney, Agent, or Firm*—Steven Capella; Dale M. Crockatt

[57] ABSTRACT

A method for correcting placement errors in a lithography system, and a system therefor, are disclosed. The method comprises the steps of obtaining metrology data of sufficient density to smoothly map an error to be corrected, deriving a metrology data grid coordinate system from the data, aligning the metrology data grid coordinate system to remove rigid body components, and for each of a plurality of lithographic fields: identifying a number of metrology sites nearest to the center of the field; establishing a reference grid coordinate system coinciding with the lithographic field; determining at least one correction factor which minimizes the residual errors; and applying at least one correction factor for at least one field to the first lithography system to correct a placement error. Such a method and system are particularly useful for error correction in e beam lithography tools.

11 Claims, 5 Drawing Sheets

5,773,836

METHOD FOR CORRECTING PLACEMENT ERRORS IN A LITHOGRAPHY SYSTEM

BACKGROUND OF THE INVENTION

1. Field of the Invention

This invention generally relates to lithography tools for the manufacture of microelectronic components, and more particularly, to a method and apparatus for correcting placement errors in substrates produced by a lithographic tool.

2. Discussion of Related Art

The use of lithography systems to expose patterns on semiconductor wafers in the fabrication of integrated circuits is well known. Step and repeat lithography systems, which operate by sequentially exposing a number of fields on a substrate, are also well known. Electron beam, ion beam and some optical exposure tools are examples of step and repeat lithography systems.

In a step and repeat lithography system, pattern placement errors are frequently found in each field. It is desirable to minimize or correct such errors. The usual method for minimizing or correcting pattern placement errors includes the steps of exposing a substrate in a lithography system, accurately measuring the position of a number of features such as test sites in the resulting pattern, comparing the measured positions with the expected positions to obtain information describing errors, and then deriving one or more correction factors. The correction factors are then used for adjusting the lithography system. The method may optionally be repeated one or more times to iteratively reduce such errors.

Much of the related prior art teaches the correction of placement errors at field boundaries to prevent stitching errors. While such corrections are useful where a critical lithographic pattern extends across a field boundary, such as may be found in large chips, such corrections do not resolve registration errors between layers in overlying fields, where such errors arise from higher order distortions. By higher order is meant distortions other than rigid body distortions.

Other prior art is directed to correcting specific types of pattern placement errors but is not generally applicable to correcting higher order placement errors within a field. The following references are representative of the state of the relevant art.

Japanese patent application JP04-037022 is directed to a method by which stitching errors due to least significant bit ("lsb") quantization effects of the field distortion corrections may be constrained to remain within +/-½ lsb. JP04-037022 does not disclose a method for correcting errors within a field.

U.S. Pat. No. 5,301,124 to Chan, et al., is directed to a method of registered writing in the case of a chip formed from multiple fields, wherein certain registration marks are extrapolated. U.S. Pat. No. 5,301,124 does not disclose a method that is applicable to blind writing where there are no registration marks, nor does it present a method whereby local distortion information from beyond the chip boundary may be used in the evaluation of distortion corrections.

U.S. Pat. No. 4,678,919 to Sugishima, et al., is directed to correcting a specific case of distortion errors resulting from elastic deformation of the substrate in unsupported regions. The method disclosed by Sugishima, et al., uses information on height variation to determine correction factors for pitch variations in patterns. The disclosed method is not applicable to correcting sources of errors not caused by elastic deformation as evidenced by height variation.

As described above, a known method of collecting information that describes placement errors is to include test sites in each field which can be measured on a metrology tool. In order to collect sufficient information to generate accurate linear corrections for each field, a minimum of four points per field are required. If higher order distortions are to be corrected, additional measurement points are required. There are several problems with this approach. Frequently, the original lithographic pattern must be modified to accommodate the metrology test sites. In the case of a large pattern, the number of fields required to make the exposure can exceed a thousand. It then becomes impractical to make the number of test site measurements required to obtain the information describing the placement errors.

The prior art does not disclose a generally applicable method for correcting higher order placement errors in a lithography system. It would thus be desirable to provide such a method and apparatus.

SUMMARY OF THE INVENTION

An object of the present invention is to overcome the problems and deficiencies in the art discussed above.

Another object of the present invention is to provide a method for correcting placement errors in a lithography system and a system providing a means therefor.

Yet another object of the present invention is to provide a method for correcting higher order placement errors in a lithography system and a system providing a means therefor.

Yet another object of the present invention is to provide a method and system for correcting higher order placement errors within a lithographic field.

Thus, according to the present invention, a method for correcting placement errors in a lithography system comprises the steps of:

(a) obtaining metrology data from at least one of a lithographic substrate produced by a first lithography system and a lithographic substrate produced by a second lithography system, wherein the second lithography system uses an image such as a mask produced by the first lithography system, said data being of sufficient density to smoothly map an error to be corrected;

(b) deriving a metrology data grid coordinate system from said metrology data;

(c) aligning the metrology data grid coordinate system to the coordinate system of said first lithography system to remove rigid body components; and (d) for each of a plurality of first lithography system substrate fields, (i) identifying a number N of metrology sites nearest to the center of the field, wherein N is not less than the number of degrees of freedom to be corrected, and wherein N is not greater than the number of metrology sites contained within a smoothness radius, and wherein none of the sites is collinear with any other two of the sites;

(iii) establishing a reference grid coordinate system wherein the origin of said reference grid coordinate system coincides with center of said field;

(iv) fitting the metrology data for the identified N metrology sites to the reference grid coordinate system to determine at least one correction factor which minimizes the residual errors; and (e) applying at least one correction factor for at least one field to said first lithography system to correct a placement error.

In addition, according to the present invention, a system for correcting placement errors in a lithography system comprises at least:

(a) a means for obtaining metrology data from at least one of a lithographic substrate produced by a first lithography system and a lithographic substrate produced by a second lithography system, wherein the second lithography system uses an image such as a mask produced by the first lithography system, said data being of sufficient density to smoothly map an error to be corrected;

(b) a means for deriving a metrology data grid coordinate system from said metrology data;

(c) a means for aligning the metrology data grid coordinate system to the coordinate system of said first lithography system to remove rigid body components; and (d) a means capable of operating on each of a plurality of first lithography system substrate fields, said means being for (i) identifying a number N of metrology sites nearest to the center of the field, wherein N is not less than the number of degrees of freedom to be corrected, and wherein N is not greater than the number of metrology sites contained within a smoothness radius, and wherein none of the sites is collinear with any other two of the sites;

(iii) establishing a reference grid coordinate system wherein the origin of said reference grid coordinate system coincides with center of said field;

(iv) fitting the metrology data for the identified N metrology sites to the reference grid coordinate system to determine at least one correction factor which minimizes the residual errors; and (e) a placement error correction means for said first lithography system which means is responsive to at least one correction factor for at least one field.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENT

In operation, the present invention provides a method and apparatus for correcting pattern placement errors that can occur on a lithographic substrate (including a lithographic mask produced by a first lithography tool for use with a second lithography tool) where the variation in placement errors are locally smooth and globally nonlinear. Pattern placement error can arise from numerous sources, including distortions present in the exposure tool or induced in the process line.

The present invention is useful for correcting any or all of the following types of placement errors: X and Y translation errors, rotation errors, X and Y trapezoidal errors, orthogonality errors, X and Y magnification errors, barrel-pincushion errors, fifth order errors, square distortion errors, cubic distortion errors, asymmetry errors, deflection coma radius errors, deflection coma length errors, fourfold deflection astigmatism errors, deflection field curvature errors, fourfold deflection distortion errors, and deflection distortion errors. The previous list is not exclusive, but merely illustrative, as it will be understood that other types of placement error may be corrected by the method disclosed.

Figure 1:
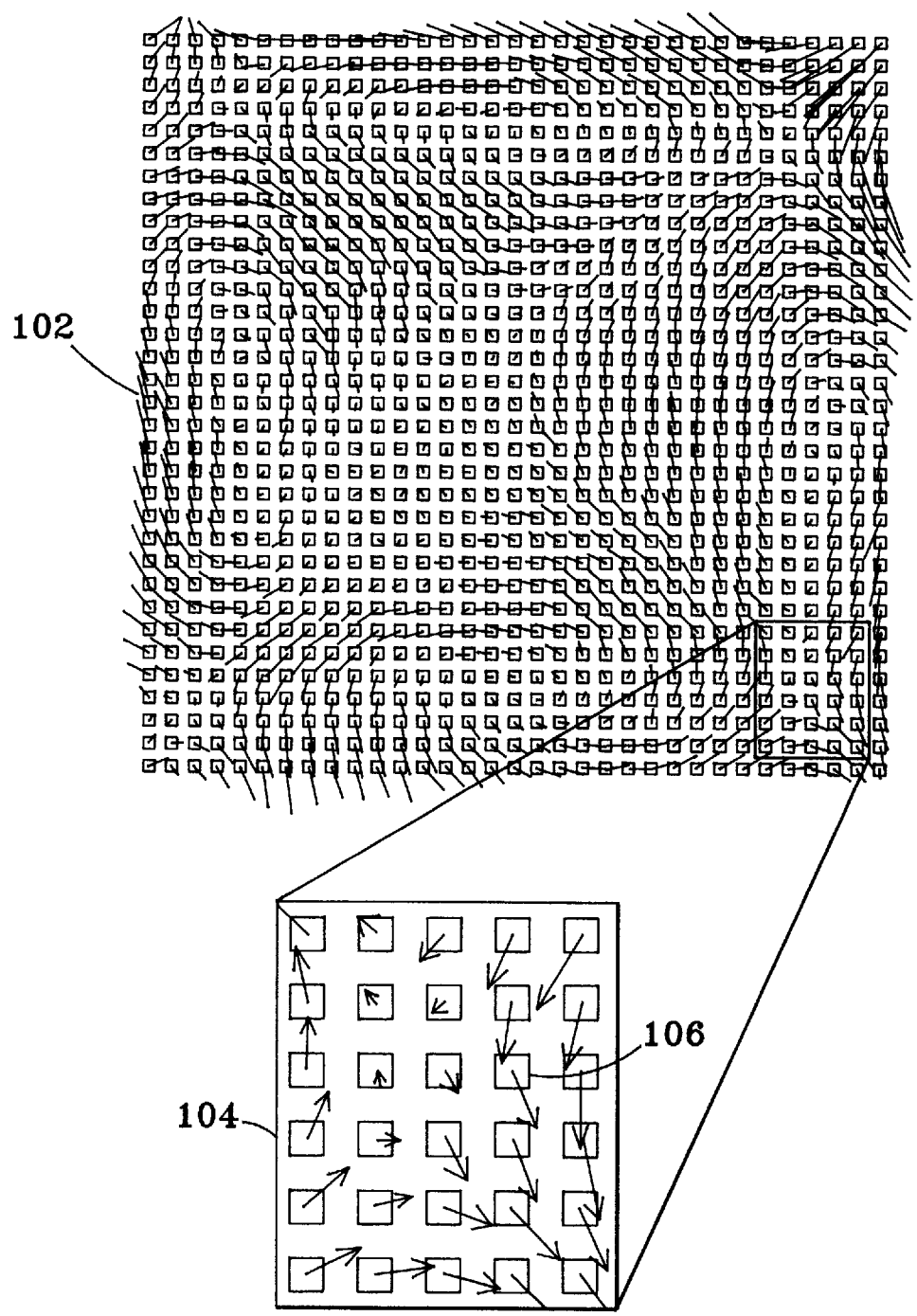
FIG. 1 shows a typical set of metrology data after removal of rigid body components, and further shows one of a plurality of fields containing the current field of interest.

The following generally describes the apparatus and method for correcting placement errors. First, a substrate is exposed on a lithography tool. The substrate may include without limitation a wafer or lithographic mask. The lithography tool may include without limitation well known e-beam, optical, or similar lithography systems. It is assumed that the pattern exposed contains a plurality of metrology sites sufficient to smoothly map the distortions to be corrected. After exposure on the lithography tool, the substrate is lithographically processed to develop an image, and then is measured on the metrology tool using known methods. The metrology tool determines the location(s) of the metrology sites relative to their designed locations. Because of the arbitrary positioning of the substrate on the metrology tool stage, in addition to the intrinsic errors due to the lithography tool and process distortion, there is an additional rigid body error present. By rigid body error is meant X, Y, and theta errors or components thereof. The metrology data is optionally electronically transferred to a computer where the data manipulation is performed and the correction factors computed. The rigid body error is removed by a well known least squares method. This includes deriving a metrology data grid coordinate system from the metrology data and mapping or aligning the metrology data grid coordinate system to the coordinate system of the exposing lithography system to remove rigid body components. FIG. 1 shows a metrology data set (102) having a local region (104) with the current field of interest (106) near the center, and is representative of the distortion errors measured by the metrology tool after the rigid body components are removed.

After the rigid body errors are removed from the metrology data, the correction factors are determined. The following description is for a single field. In a preferred embodiment the procedure is repeated for all of the fields required to completely expose the pattern.

First, a number N of metrology sites is determined. The number of correction factors available in the lithography tool's hardware determines the minimum number of metrology sites required to compute a correction. For a system that has the ability to correct X and Y translation, rotation, skew, X and Y magnification and X and Y trapezoidal errors, the minimum number of metrology points required is 4. In the foregoing example N would be not less than 4.

A key feature of the invention is that none of the N sites is collinear with any other two of the sites. This is required to avoid degeneracy.

Another key feature of the invention is that N is not greater than the number of metrology sites contained within a smoothness radius. It will be understood that the smoothness radius, or smoothness limit, defines the border of a region centered on the current field of interest. Within the smoothness radius, a function characterized by the correction coefficients adequately describes the distribution of placement errors to some predetermined level of accuracy. Beyond the smoothness radius, the global nonlinear character of the substrate results in significant deviations between the actual errors at a given location and those predicted by the correction function. Thus, the correction function, together with the correction coefficients, serves to model the distribution of placement errors contained within the smoothness radius. Standard methods exist for determining the quality of a model in describing a sample distribution. See, for example, W. H. Press, S. A. Teukolsky, W. T. Vetterling, and B. P. Flannery, Numerical Recipes in C, Cambridge University Press, Cambridge, 1992. at chapter 15.

To determine the smoothness radius, a trial value large enough to encompass the minimum required number of metrology points is selected. The minimum value for the smoothness radius is determined by the criteria that the smoothness radius must contain at least enough data points equal to the available degrees of freedom in the correction function.

Once the points are selected, their design coordinates combined with the positional error data to permit determination of the correction coefficients by a least squares method. Once a set of correction coefficients are determined, the model is then tested against the data. As long as the model tests within the predetermined quality limits, the smoothness radius is increased to encompass additional points and the testing repeated. When the model reaches the previously determined limits set by the accuracy requirements, the smoothness radius has been found. The correction coefficients determined at the last value of the smoothness radius that test within the quality limit are then stored as an entry associated with the current field of interest in a table of such values.

The steps described above are preferably repeated for each field on the substrate until a table of correction factors is built up which contains an entry for each field. The table of correction factors is then applied to the lithography system in order to change system characteristics and thus correct errors during subsequent exposures.

It will be understood that the disclosed method may be practiced on a data processing apparatus, either alone or in combination with other well known apparatus such as metrology systems and e-beam or optical lithography systems.

To further describe an embodiment of the present invention, one method by which the correction coefficients are determined is shown by the two flowcharts of FIGS. 2 and 3a–d.

Figure 2:
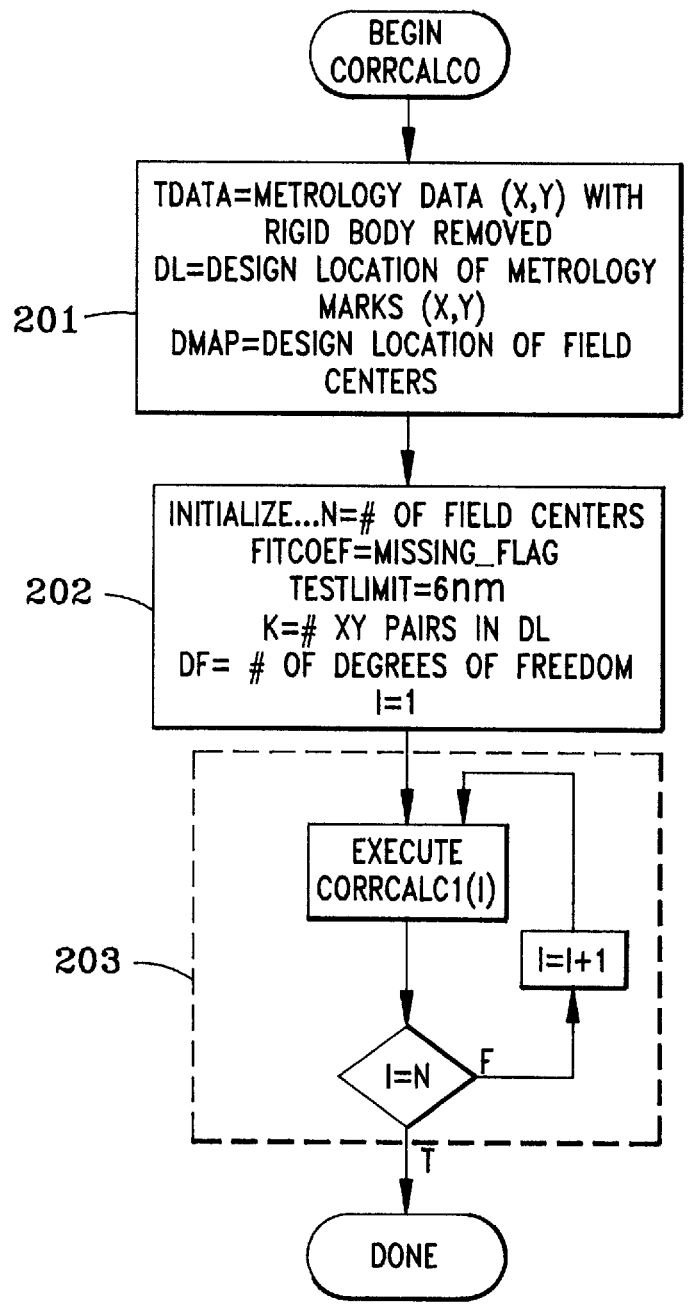
FIG. 2 shows a flow chart of method steps.

FIG. 2 shows the main loop of the method sequence together with the inputting of the necessary data. With reference to FIG. 2, Step 201 shows the necessary input data for the implementation of the method. TDATA is a data structure returned from the metrology tool consisting of the measured X,Y displacement of the metrology marks from their intended design location after the mathematical removal of any rigid body components. DL is a data structure consisting of a set of X,Y pairs describing the design location of the metrology sites on the substrate. DMAP is a data structure consisting of a set of X,Y pairs describing the design location of the center of the fields used to expose the pattern(s) on the substrate.

Step 202 initializes a variable N, equal to the number of X,Y pairs in DMAP. The data structure FITCOEF is initialized with a unique value MISSING_FLAG which serves as an indicator to the system that there is no valid data present. FITCOEF holds N times the number of fit coefficients that it is desired to determine for each field. I is used as a counter as the loop in step 203 processes each field. TESTLIMIT is related to the statistical measure discussed in step 318. The smoothness limit to be determined here, is the largest region for which correction terms may be computed subject to the statistical measure of the residual errors remaining below TESTLIMIT. Since the statistical measure being used here is the standard deviation, TESTLIMIT is related to the specified standard deviation of the substrate. TESTLIMIT is set in this example to 6 nm, chosen by taking ½ rss of a 25 nm 3 sigma specification. K is a constant equal to the number of XY pairs in DL, used later in step 312. DF is the number of degrees of freedom available in the chosen hardware correction implementation.

Step 203 shows the iterative loop through the procedure CORRCALC1. CORRCALC1 is the routine which evaluates the smoothness limits and determines the correction coefficients.

Figure 3:
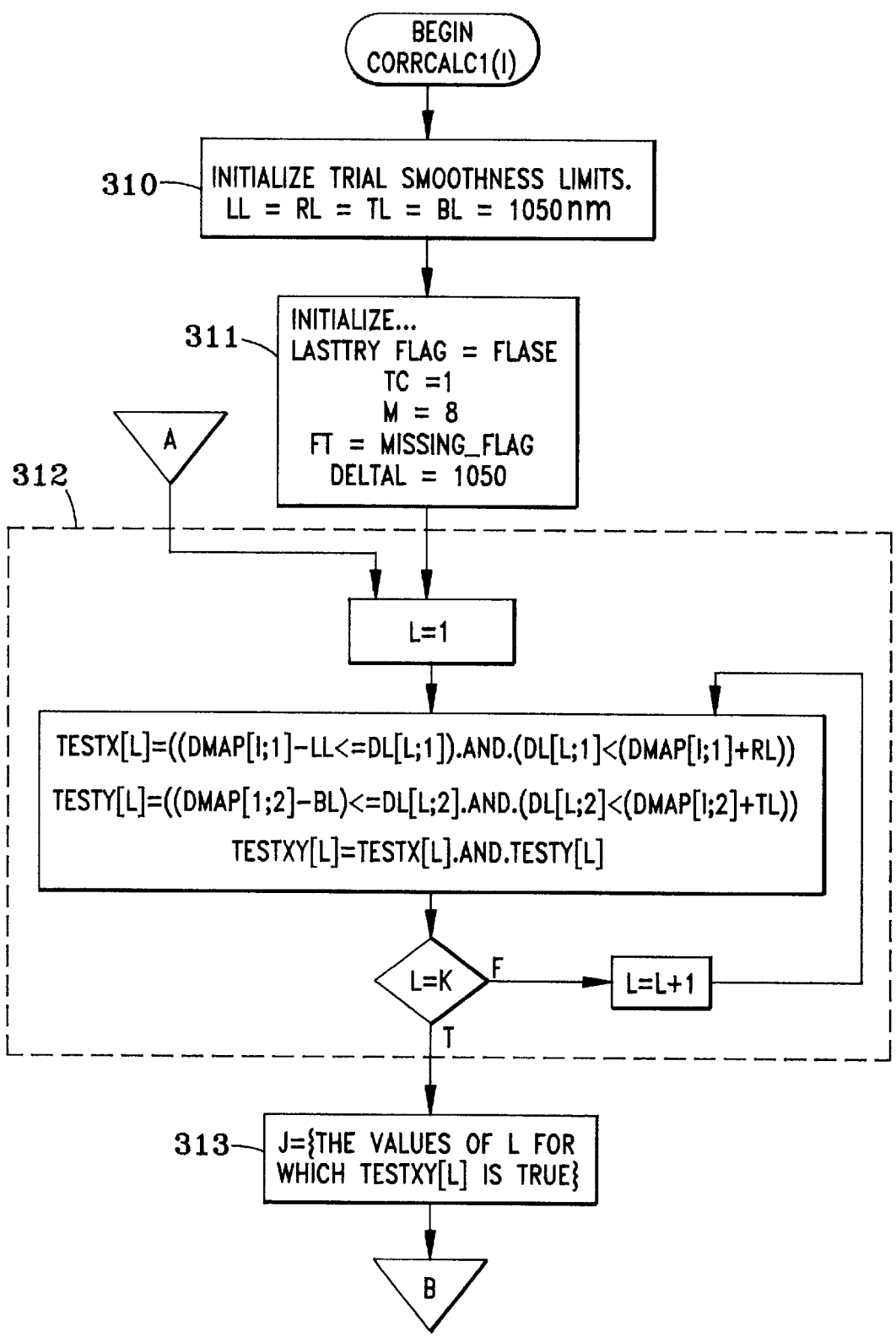
FIG. 3 shows a flow chart of a portion of the method for determining the number of metrology sites contained within a preselected smoothness radius, all according to the present invention.
Figure 4:
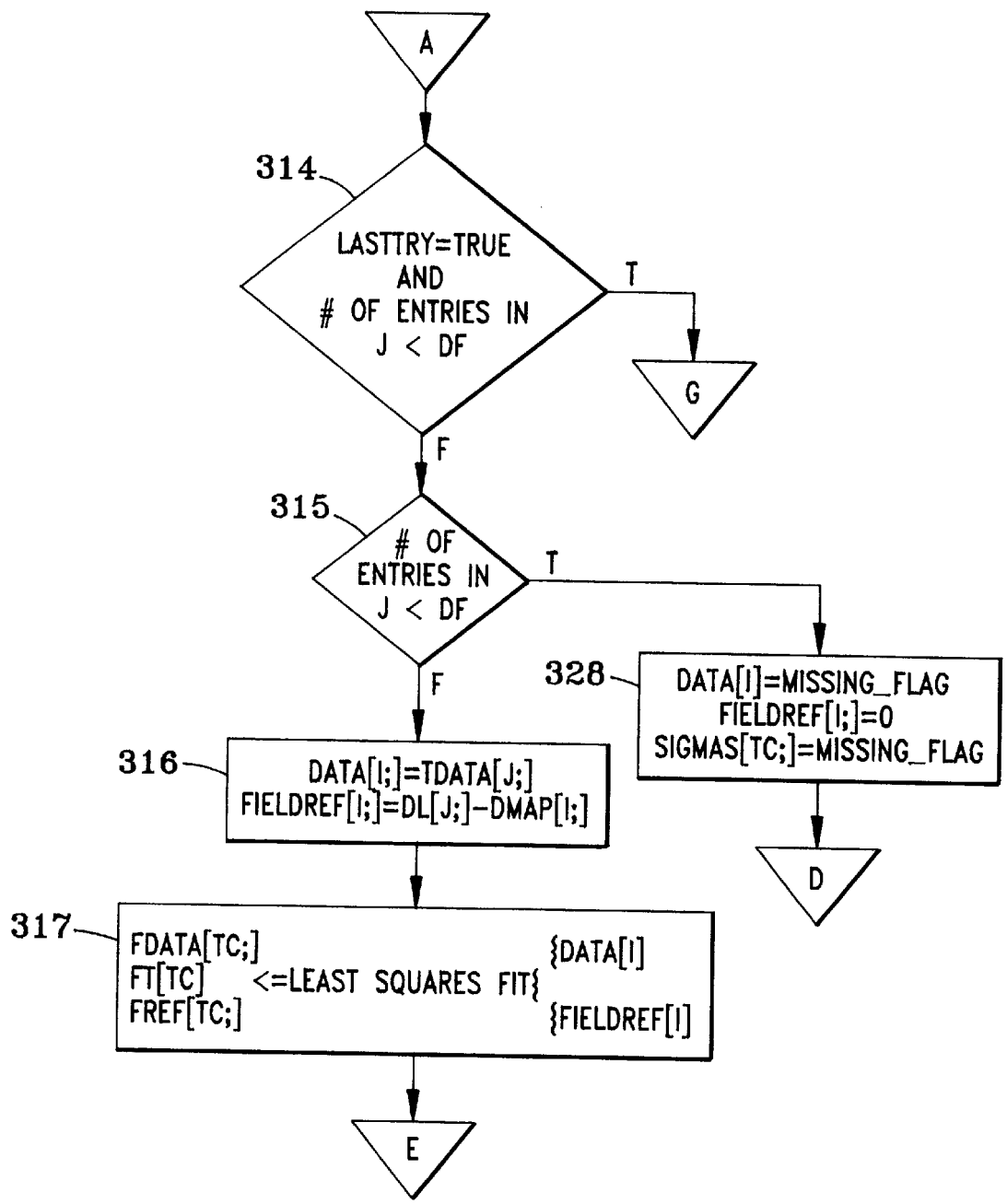
Figure 6:
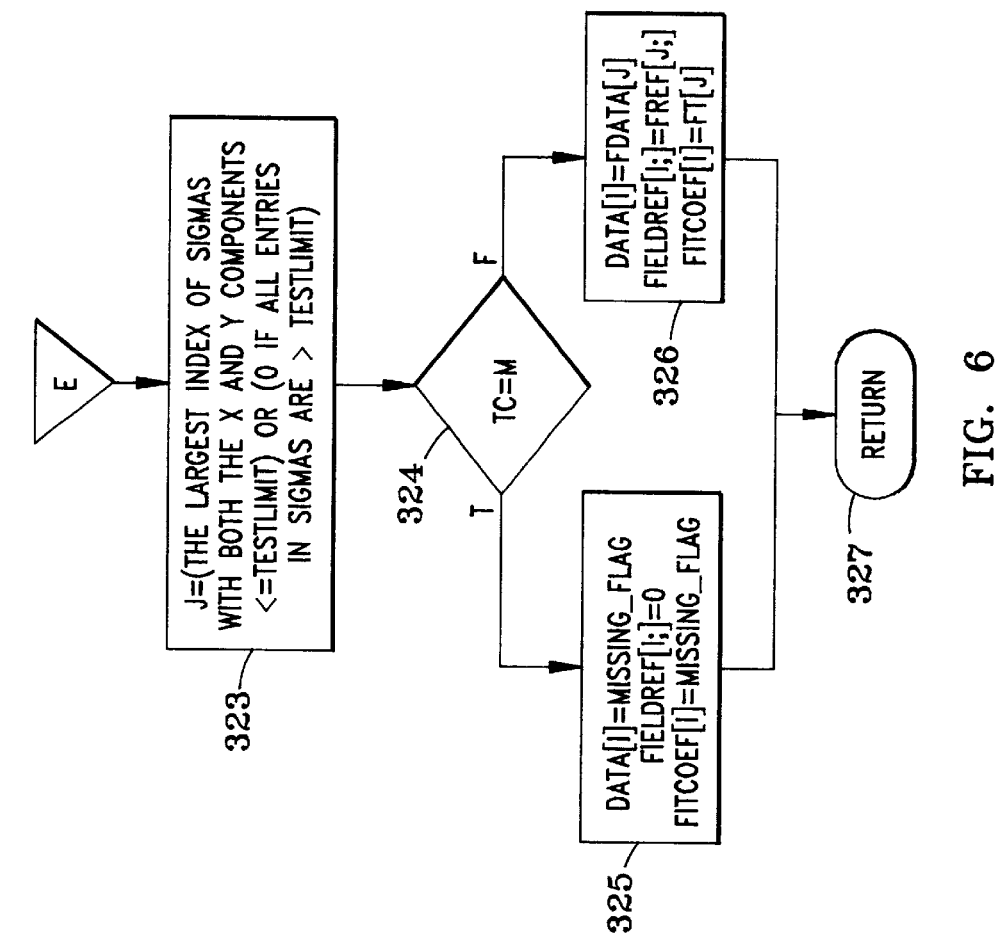
Figure 5:
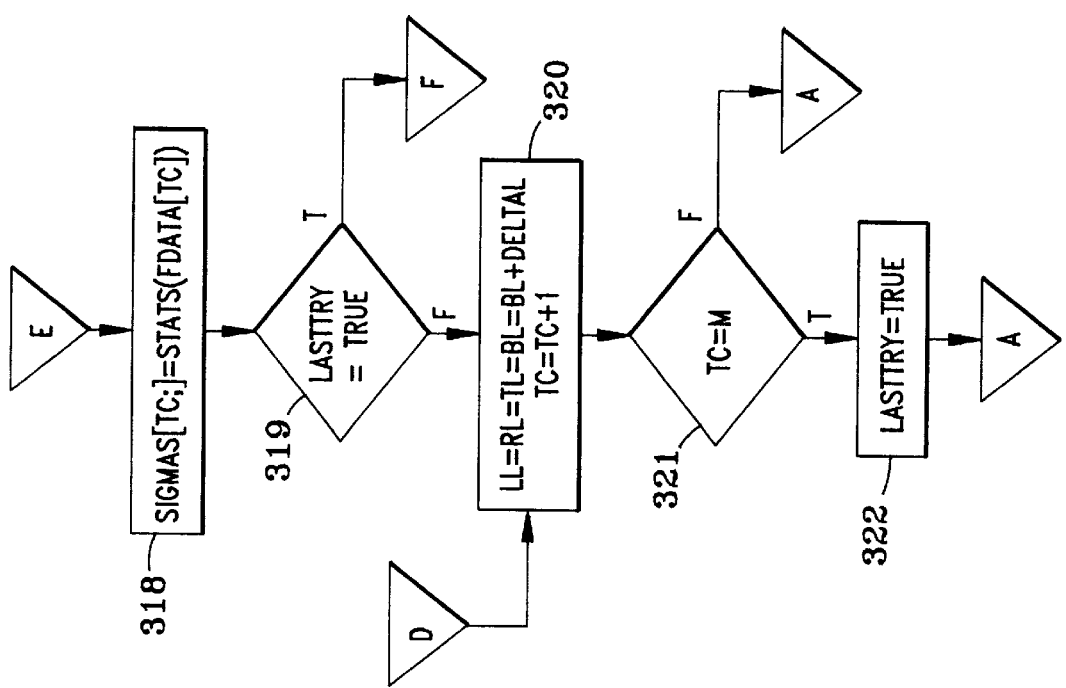

CORRCALC1 begins with step 310 in FIG. 3. Four equal trial values for the smoothness limits are defined, LL,RL,TL and BL and represent respectively the distance from the center of the field of the left, right, top and bottom boundaries of a square region to be searched for the metrology data to be used in generating the correction coefficients. The value 1050 $\mu$m is used here as an example and represents ½ of the field size. The initial value of these limits is not restricted to this value however.

Step 311 initializes several variables that are needed each time CORRCALC1 is called. The variable LASTTRY is a logical flag that is initially set to FALSE. CORRCALC1 is going to compute correction coefficients for a set of different trial values for the smoothness limits. The value of LASTTRY will be set to TRUE when processing the last trial value in the set. TC is an index counter, used to keep track of which iteration of trial smoothness limits is being processed. M is the limit on the number of different trial limits to be tested, set here to 8 by way of example. This value is also arbitrary, but is limited by the dimensions of the substrate and the size of the smoothness limit test increment DELTAL. DELTAL is set here to 1050 um, but other values could be used as well. FT is a temporary data structure used to store the fit coefficients computed for each of the trial values of the smoothness limits.

Loop 312 is used to find the entries in the metrology data that are bounded by the trial smoothness limits. TESTX is a logical data structure which is TRUE for any values of L which find an entry between LL and RL centered on DMAP [I;1]. The 1 in DMAP[I;1] indicates the test only applies to the X component. TESTY performs a similar test for the Y axis. The limits are between BL and TL centered on DMAP [I;2]. TESTXY is the logical AND of TESTX and TESTY.

Step 313 extracts from TESTXY a set of pointers to the entries in DL which lie within the smoothness limits and stores them in J.

Decision steps 314 and 315 perform a test to determine if there is a sufficient quantity of data within the trial smoothness radius to perform any fitting. If the conditions in decision step 314 are true, then the method has examined the entire range of smoothness limits without finding enough points to do any fitting. The method then flows to step 325 which handles that situation. If decision step 315 is true, then flow branches to step 328 where DATA[I;] and FIELDREF [I;] are marked missing as well as the TC entry of SIGMAS. Step 328 then flows to step 320 where the next iteration of the loop is set up. If both decision steps are FALSE, then the method branches down to step 316.

In step 316, the set of pointers, J, set in step 313 is used to extract the displacement vectors from TDATA and store them in a temporary structure DATA[I;]. The ; indicates that the J set of both the X and Y components are being manipulated. The second entry in step 316 shows the construction of the local field reference. Subtraction of the field center coordinate DMAP[I;] from the set of DL[J;] produces the local coordinate system.

Step 317 invokes a standard least squares fitting technique that operates on DATA and FIELDREF to produce FDATA [TC;] which contains the residual errors after the fitting process, FT[TC] are the fit coefficients for iteration TC. FREF[TC;] is a copy of FIELDREF[I;] used for this iteration of TC. The specific implementation of the least squares fitting routine does need to be programmed to model the hardware correction capabilities of the lithography system.

Step 318 invokes a conventional function STATS to compute a statistical measure of the quality of the fit from the X and Y residual distribution FDATA[TC; ]. The results are stored in a temporary data structure SIGMAS. Here the standard deviation is being used as the statistical measure, but other measures are possible.

Decision step 319 is used to test for termination of the iterative evaluation of the smoothness limits. If LASTTRY is TRUE, then the method branches to step 323 where the intermediate results are evaluated and a smoothness limit selected. If LASTTRY is FALSE, then the method proceeds to step 320 to set up another pass.

Step 320 increments the smoothness limits by DELTAL, defined in step 311, and increments the loop counter TC by 1.

Decision step 321 compares the loop counter TC to M, the limit on the number of loops. If TC is not equal to M, the method branches to step 12, to begin another pass through the loop. If TC is equal to M, LASTTRY is set to TRUE in step 322 and the method again branches to step 312, this time for the final pass through the loop.

Step 323 tests the entries in data structure SIGMAS against TESTLIMIT. Since progressively larger indices in SIGMAS correspond to larger trial smoothness limits, selecting the largest index with values at or below TESTLIMIT determines the smoothness limit and the number of points to be evaluated. It may be the case that the metrology data is noisy or otherwise does not match the model against which the data is being fit. If that occurs, then none of the values within SIGMAS may lie within the range of TESTLIMIT and no smoothness limits can be determined. In this case J is set equal to 0 to indicate this condition.

Decision step 324 tests the value of J set in step 323. If J is not equal to zero, the method proceeds to step 326 where the Jth entry in the temporary data structure of fit coefficients FT is assigned to the entry in FITCOEF for field number I. The data points and the local field reference are also stored as the Ith entry in DATA and FIELDREF respectively. If J equals 0, indicating that no test limits were found the flow proceeds instead through step 325. No change is made to FITCOEF[I], leaving it with the MISSING_FLAG assignment made initially in step 202. DATA and FIELDREF are assigned MISSING_FLAG and 0 respectively. Step 325 and 26 both then proceed to the return step 327, returning control to the loop in step 203.

Upon a reading of the present disclosure, it will be apparent to the skilled artisan that other embodiments of the present invention beyond those embodiments specifically described herein may be made or practiced without departing from the spirit of the invention. Similarly, changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method for correcting placement errors in a lithography system comprising the steps of:
   (a) obtaining metrology data from at least one substrate selected from (i) a lithographic substrate produced by a first lithography system and (ii) a lithographic substrate produced by a second lithography system using a substrate produced by said first lithography system, said data being of sufficient density to smoothly map an error to be corrected;
   (b) deriving a metrology data grid coordinate system from said metrology data;
   (c) aligning the metrology data grid coordinate system to the coordinate system of said first lithography system to remove rigid body errors; and
   (d) for each of a plurality of first lithography system substrate fields,
      (i) determining a smoothness radius about the center of said field and the total number of metrology sites lying within an area defined by said smoothness radius about the center of said field;
      (ii) identifying from said total number of metrology sites in step (d)(i) a number N of metrology sites about the center of the field, wherein N is not less than the number of degrees of freedom to be corrected, and wherein none of the N sites is collinear with any other two of the sites;
      (iii) establishing a reference grid coordinate system wherein the origin of said reference grid coordinate system coincides with center of said field; and
      (iv) fitting the metrology data for the identified N metrology sites to the reference grid coordinate system to determine at least one correction factor which minimizes residual errors; and
   (e) applying at least one correction factor for at least one field to said first lithography system to correct a placement error.

2. The method of claim 1 wherein the substrate from which said metrology data is obtained in step (a) is a lithographic mask produced by said first lithography system.

3. The method of claim 1 wherein the substrate from which said metrology data is obtained in step (a) is a microelectronic substrate exposed with said second lithography system.

4. The method of claim 1 wherein the metrology data grid coordinate system is aligned to the coordinate system of said first lithography system in step (c) by a least squares fitting method.

5. The method of claim 1 wherein a plurality of correction factors for a field are determined and wherein said plurality of correction factors are selected from the group consisting of an X translation correction factor, a Y translation correction factor, a rotation correction factor, an X trapezoidal correction factor, a Y trapezoidal correction factor, an orthogonality correction factor, an X magnification correction factor, a Y magnification correction factor, a barrel-pincushion correction factor, a fifth order correction factor, a square distortion correction factor, a cubic distortion correction factor, an asymmetry correction factor, a deflection coma radius correction factor, a deflection coma length correction factor, a fourfold deflection astigmatism correction factor, a deflection field curvature correction factor, a fourfold deflection distortion correction factor, and a deflection distortion correction factor.

6. A system for correcting placement errors in a lithography system comprising:
   (a) a means for obtaining metrology data from at least one substrate selected from (i) a lithographic substrate produced by a first lithography system and (ii) a lithographic substrate produced by a second lithography system using a substrate produced by said first lithography system, said data being of sufficient density to smoothly map an error to be corrected;
   (b) a means for deriving a metrology data grid coordinate system from said metrology data;
   (c) a means for aligning the metrology data grid coordinate system to the coordinate system of said first lithography system to remove rigid body error; and
   (d) a means capable of operating on each of a plurality of first lithography system substrate fields, said means being for
      (i) determining a smoothness radius about the center of said field and the total number of metrology sites lying within an area defined by said smoothness radius about the center of said field;
      (ii) identifying from said total number of metrology sites in step (d)(i) a number N of metrology sites about the center of the field, wherein N is not less than the number of degrees of freedom to be corrected, and wherein none of the N sites is collinear with any other two of the N sites;
      (iii) establishing a reference grid coordinate system wherein the origin of said reference grid coordinate system coincides with center of said field; and
      (iv) fitting the metrology data for the identified N metrology sites to the reference grid coordinate system to determine at least one correction factor which minimizes residual errors; and
   (e) a placement error correction means for said first lithography system which means is responsive to at least one correction factor for at least one field of said first lithography system.

7. The system of claim 6 wherein said means for obtaining metrology data is a means for obtaining said data from a substrate which is a lithographic mask produced by said first lithography system.

8. The system of claim 6 wherein said means for obtaining metrology data is a means for obtaining said data from a substrate which is a microelectronic substrate exposed with said second lithography system.

9. The system of claim 6 wherein said means for aligning the metrology data grid coordinate system further comprising a means for performing a least squares fit.

10. The system of claim 6 further comprising a means for simultaneously determining a plurality of correction factors selected from the group consisting of an X translation correction factor, a Y translation correction factor, a rotation correction factor, an X trapezoidal correction factor, a Y trapezoidal correction factor, an orthogonality correction factor, an X magnification correction factor, a Y magnification correction factor, a barrel-pincushion correction factor, a fifth order correction factor, a square distortion correction factor, a cubic distortion correction factor, an asymmetry correction factor, a deflection coma radius correction factor, a deflection coma length correction factor, a fourfold deflection astigmatism correction factor, a deflection field curvature correction factor, a fourfold deflection distortion correction factor, and a deflection distortion correction factor.

11. A data processing system for correcting placement errors in a lithography system, said data processing system comprising:
   (a) a means for inputting metrology data relating to at least one substrate selected from (i) a lithographic substrate produced by a first lithography system and (ii) a lithographic substrate produced by a second lithography system using a substrate produced by said first lithography system, said data being of sufficient density to smoothly map an error to be corrected;
   (b) a means for deriving a metrology data grid coordinate system from said metrology data;
   (c) a means for aligning the metrology data grid coordinate system to the coordinate system of said first lithography system to remove rigid body error; and
   (d) a means capable of operating on each of a plurality of first lithography system substrate fields, said means being for
      (i) determining a smoothness radius about the center of said field and the total number of metrology sites lying within an area defined by said smoothness radius about the center of said field;
      (ii) identifying from said total number of metrology sites in step (d)(i) a number N of metrology sites about the center of the field, wherein N is not less than the number of degrees of freedom to be corrected, and wherein none of the N sites is collinear with any other two of the N sites;
      (iii) establishing a reference grid coordinate system wherein the origin of said reference grid coordinate system coincides with center of said field; and
      (iv) fitting the metrology data for the identified N metrology sites to the reference grid coordinate system to determine at least one correction factor which minimizes residual errors; and
   (e) a means for outputting correction factors for said lithography system.

* * * * *